United States Patent [19]
Nelson

[11] Patent Number: 6,094,077
[45] Date of Patent: Jul. 25, 2000

[54] DYNAMICALLY CONTROLLED TIMING SIGNAL GENERATOR

[75] Inventor: Theodore G. Nelson, Portland, Oreg.

[73] Assignee: Tektronix, Inc., Beaverton, Oreg.

[21] Appl. No.: 09/156,320

[22] Filed: Sep. 18, 1998

[51] Int. Cl.[7] .................................................. H03K 4/06
[52] U.S. Cl. ........................ 327/131; 327/132; 327/137
[58] Field of Search .................................... 327/131, 132, 327/133, 134, 135, 136, 137, 138, 139, 140

[56] References Cited

U.S. PATENT DOCUMENTS 5,825,218  10/1998  Colli et al. ............................ 327/112
5,914,621   6/1999  Coy ...................................... 327/134

*Primary Examiner*—Jeffrey Zweizig
*Attorney, Agent, or Firm*—David N. Caracappa; Thomas F. Lenihan

[57] ABSTRACT

A dynamically controlled timing signal generator includes a source of a controlled current, a timing signal generating circuit coupled to the controlled current source for generating the timing signal, and a feedback circuit coupled to the controlled current source for controlling the controlled current source to produce a desired controlled current.

8 Claims, 1 Drawing Sheet

DYNAMICALLY CONTROLLED TIMING SIGNAL GENERATOR

FIELD OF THE INVENTION

The present invention relates to timing signal generators fabricated in CMOS integrated circuits (ICs) which provide relatively accurate timing signals despite relatively wide absolute component characteristic tolerances during IC fabrication.

BACKGROUND OF THE INVENTION

Inherent variations in the CMOS IC fabrication process produce component elements, e.g. capacitors, resistors, transistors etc., that have very poor absolute characteristic tolerances. For example, absolute tolerances of fabricated elements range from 10% to 20%. However, using ratio matching, it is possible to fabricate two or more elements, of the same type, whose characteristics are very closely matched, even though the absolute tolerance may vary more widely. For example, matching tolerances of 0.5% may be achieved.

It is sometimes required to provide relatively high accuracy timing signals in CMOS ICs. For example, it may be required to fabricate a ramp signal generator of relatively tight absolute frequency and amplitude accuracy. A ramp signal generator, however, requires two types of elements: a current source and a capacitor. While it is possible to match the characteristics of two or more current sources, or of two or more capacitors, it is not possible to accurately match a current source to a capacitor. Because of this, variations of 20% to 40% of ramp timing for ramp signal generators may occur.

It is desirable to fabricate a timing signal generator, such as a ramp signal generator, which provides the required accuracy of the frequency and amplitude of the ramp signal despite the inherent component characteristic variations inherent in the IC fabrication process.

In accordance with principles of the present invention, a timing signal generator includes a source of a controlled current, a timing capacitor coupled to the controlled current source for generating the timing signal, and a feedback circuit coupled to the controlled current source for controlling the controlled current source to produce a predetermined controlled current.

The feedback circuit provides dynamic control of the current, permitting accurate timing signals, despite component characteristic variations inherent in the IC fabrication process.

DETAILED DESCRIPTION

Figure 1:
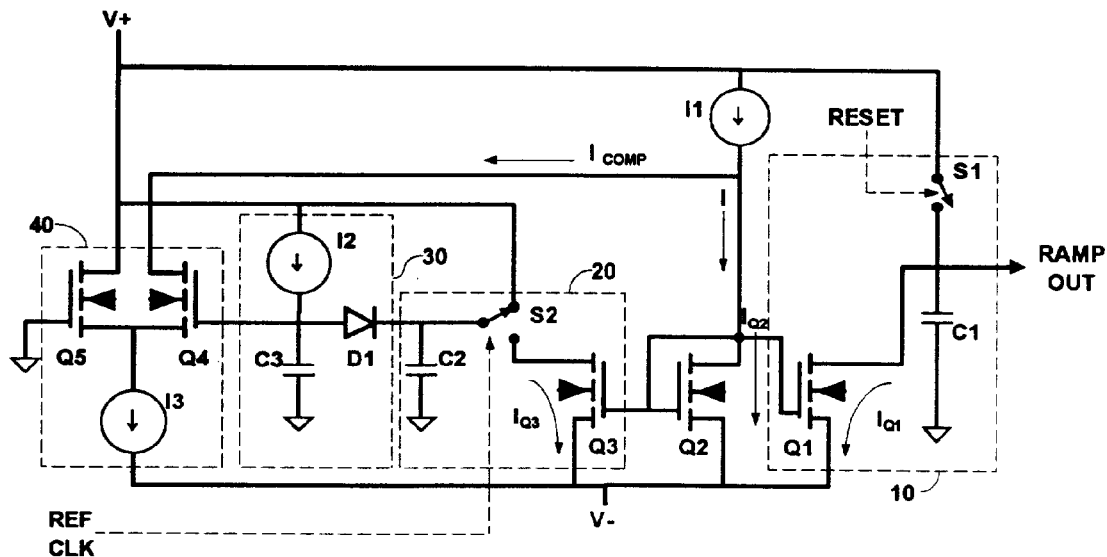
FIG. 1 is a diagram, partially in block form and partially in schematic form, of a timing signal generator according to the present invention.

FIG. 1 is a diagram, partially in block form and partially in schematic form, of a timing signal generator according to the present invention. In FIG. 1, the timing signal generator is fabricated on an IC, and generates a ramp timing signal having a predetermined amplitude and frequency. In FIG. 1, a source of positive operating potential V+ is coupled to a first terminal of a single-pole-single-throw (SPST) switch S1. A second terminal of the SPST switch S1 is coupled to a first electrode of a timing capacitor C1, to a first electrode of the main conduction path of a first CMOS transistor Q1 and to an output terminal producing the ramp timing signal. A source (not shown) of a reset signal (RESET) is coupled to a control input terminal of the SPST switch S. A second electrode of the timing capacitor C1 is coupled to a source of reference potential (ground). A second electrode of the main conduction path of the first transistor Q1 is coupled to a source of a negative operating potential V−. The combination of the SPST switch S1, the timing capacitor C1 and the first transistor Q1 form a primary ramp signal generating circuit 10.

A first terminal of a first fixed current source I1 also is coupled to the positive operating potential source V+. A second terminal of the first fixed current source I1 is coupled to a first branch conducting a controlled current I, and a second branch conducting a compensation current $I_{comp}$. The first branch is coupled to a first electrode of a main conducting path of a second CMOS transistor Q2, and to respective control electrodes of the first transistor Q1, the second transistor Q2, and a third CMOS transistor Q3. A second electrode of the main conducting path of the second transistor Q2 is coupled to the negative operating potential source V−.

A first terminal of a single-pole-double-throw (SPDT) switch S2 also is coupled to the positive operating potential source V+. A second terminal of the SPDT switch S2 is coupled to a first electrode of a main conducting path of the third CMOS transistor Q3. A source (not shown) of a reference clock (REF CLK) signal is coupled to a control input terminal of the SPDT switch S2. A second electrode of the main conducting path of the third transistor Q3 is coupled to the negative operating potential source V−. The pole of the SPDT switch S2 is coupled to a first electrode of a reference capacitor C2 and a cathode of a diode D1. A second electrode of the reference capacitor C2 is coupled to a source of a reference potential (ground). The combination of the SPDT switch S2, the reference capacitor C2 and the third transistor Q3 form the reference timing signal generator 20.

A first terminal of a second fixed current source I2 also is coupled to the positive operating potential source V+. A second terminal of the second fixed current source I2 is coupled to an anode electrode of the diode D1, to a first electrode of a peak detecting capacitor C3 and to a control electrode of a fourth CMOS transistor Q4. A second electrode of the peak detecting capacitor C3 is coupled to ground. The combination of the second fixed current source I2, the diode D1 and the peak detecting capacitor C3 form a peak detector circuit 30. In the illustrated embodiment, the peak detector 30 is a negative peak detector.

The second branch coupled to the second terminal of the first fixed current generator I1, conducting the compensation current $I_{COMP}$, is coupled to a first electrode of the main conducting path of the fourth transistor Q4. A second electrode of the main conducting path of the fourth transistor Q4 is coupled to a first terminal of a third fixed current source I3. A second terminal of the third fixed current source I3 is coupled to the negative operating potential source V−. A first electrode of a main conducting path of a fifth CMOS transistor Q5 also is coupled to the positive operating potential source V+. A second electrode of the main conducting path of the fifth transistor Q5 is also coupled to the first terminal of the third fixed current source I3. The control electrode of the fifth transistor Q5 is coupled to ground. The combination of the fourth transistor Q4, the fifth transistor Q5 and the third fixed current source I3 form a comparator 40.

Figure 2:
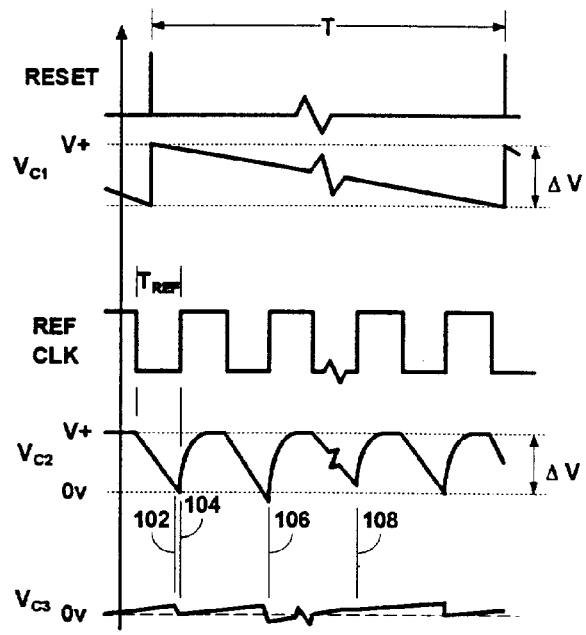
FIG. 2 is a waveform diagram useful in understanding the operation of the timing signal generator illustrated in FIG. 1.

FIG. 2 is a waveform diagram useful in understanding the operation of the timing signal generator illustrated in FIG. 1. The top two waveforms of FIG. 2 relate to the operation of the primary ramp signal generator 10 (of FIG. 1). The topmost waveform represents the RESET signal controlling the SPST switch S1, and the second waveform represents the ramp timing output signal, which is the voltage $V_{C1}$ across the timing capacitor C1. The RESET signal is a series of short pulses separated by a time duration T. When the RESET signal is low, the SPST switch S1 is open, and when the RESET signal is high, the SPST switch S1 is closed. When the SPST switch S1 is closed in response to a RESET signal pulse, the voltage across the timing capacitor C1 charges to the positive operating potential V+. When the SPST switch S1 is open, the timing capacitor C1 discharges through the main conduction path of the first transistor Q1.

The current $I_{Q1}$ through the main conduction path of the first transistor Q1 is controlled, in a manner to be described in more detail below, to be a constant current. Because the timing capacitor C1 is being discharged via a constant current $I_{Q1}$, the voltage across the timing capacitor C1 decreases linearly, forming the ramp voltage $V_{C1}$ illustrated in the second waveform of FIG. 2. The desired constant current $I_{Q1}$ is controlled, in a manner to be described in more detail below, so that the ramp timing output signal changes amplitude by the desired voltage difference $\Delta V$ over time period T. If the controlled current $I_{Q1}$ is set too low, then the timing capacitor C1 does not discharge enough and $\Delta V$ is too small, and if the controlled current $I_{Q1}$ is too high, then the timing capacitor C1 discharges too much and $\Delta V$ is too large.

$$\Delta V = I_{Q1} \frac{T}{C1} \quad (1)$$

The timing capacitor C1 discharges according to equation (1) in which $\Delta V$ is the change in amplitude of the ramp timing output signal, T is the time between RESET pulses, $I_{Q1}$ is the controlled current through transistor Q1, and C1 is the capacitance of capacitor C1. Thus, it can be seen that the period of the ramp timing output signal is controlled by the period of the reset signal, and the amplitude of the ramp timing output signal is controlled by the controlled current $I_{Q1}$ through transistor Q1. The remainder of FIG. 1 illustrates a feedback circuit which controls the controlled current $I_{Q1}$ to the desired current.

The first fixed current source I1 produces a fixed constant current. This current is supplied to two paths. The first path conducts a controlled current, having a value I, which in turn passes through the main conduction path of the second transistor Q2 as current $I_{Q2}$. The first and second transistors, Q1 and Q2, are coupled in a current mirror configuration such that the second transistor Q2 is the current sensing transistor, and the first transistor Q1 is the current mirror transistor. The first and second transistors, Q1 and Q2, are also ratioed so that the area of the transistor Q2 is n times the area of the transistor Q1. In the illustrated embodiment, the first and second transistors, Q1 and Q2, are ratioed so that the area of the transistor Q2 is seven times the area of the transistor Q1. Thus, when the current sense transistor Q2 conducts current $I_{Q2}$, the current mirror transistor Q1 conducts current $I_{Q1}=I_{Q2}/7$. However, one skilled in the art will understand that the first and second transistors, Q1 and Q2, can be ratioed at any ratio, so that the current through the current mirror transistor Q1 may be more accurately selected and controlled.

The second path from the first fixed current source I1 conducts a compensating current $I_{COMP}$. The compensating current $I_{COMP}$ is controlled by the feedback circuit so that the current $I=I_{Q2}$ is set accurately, thereby setting the current $I_{Q1}$ and thus the $\Delta V$ of the ramp timing output signal accurately in accordance with equation (1). The third transistor Q3 is also ratio matched to the current sense transistor Q2, and is coupled in a current mirror configuration with the current sense transistor Q2. The third transistor operates as a reference current transistor. In the illustrated embodiment, the area of the current transistor Q3 is set equal to the area of the current sense transistor Q1. Thus, the current $I_{Q3}$ conducted by the reference transistor Q3 is equal to the current $I_{Q2}$ conducted by the current sense transistor Q2, i.e. I. But, as before, the reference transistor Q3 can be ratioed to produce any desired reference current $I_{Q3}$.

In the reference timing signal generator 20, the second capacitor C2 operates as a reference capacitor, in a manner to be described below. The SPDT switch S2 couples the reference capacitor C2 to either the positive operating potential V+ or the main conduction path of the third transistor Q3 as controlled by: the REF CLK signal. The REF CLK signal is a rectangular wave, illustrated in the third waveform of FIG. 2. When the REF CLK signal is high, the SPDT switch S2 couples the reference capacitor C2 to the positive source of operating potential V+, and when the REF CLK signal is low, the SPDT switch S2 couples the reference capacitor C2 to the main conduction path of the third transistor Q3. Thus, when the REF CLK signal is high, the reference capacitor C2 charges to the positive operating potential V+. When the REF CLK signal is low, the reference capacitor C2 discharges through the main conduction path of the third transistor Q3. Although in the illustrated embodiment the reference capacitor C2 is charged to the positive operating potential V+, one skilled in the art will understand that any other positive reference potential could be used instead.

As described above, the reference current transistor Q3 is operating as a current mirror transistor and is conducting a constant current $I_{Q3}$. Because the reference capacitor C2 is discharging through a constant current, the voltage across the reference capacitor C2 drops linearly until the REF CLK signal goes high again after a discharge time period TEF. The voltage $V_{C2}$ across the reference capacitor C2 is illustrated in the fourth waveform in FIG. 2.

In the negative peak detector circuit 30, the third capacitor C3 operates as a peak detecting capacitor. Through the diode D1 the peak detecting capacitor C3 detects the negative peak voltage across the reference capacitor C2, in a known manner. When the reference voltage $V_{C2}$ drops below the negative peak voltage $V_{C3}$, (time 102 in FIG. 2) the diode D1 conducts, and the capacitor C3 discharges to the same voltage $V_{C2}$ as the reference capacitor C2. When the reference voltage $V_{C2}$ is greater than the negative peak voltage $V_{C3}$, (time 104) the diode D1 becomes non-conductive. The peak detecting capacitor C3 gradually charges through the second fixed current source I2, but the value of the current through the second current source I2 is set to a low value to minimize the ripple voltage across the peak detecting capacitor C3. The voltage $V_{C3}$ across the peak detecting capacitor C3 is illustrated in the fifth waveform in FIG. 2.

To produce a desired value of the controlled current I, the negative peak voltage $V_{C3}$ is maintained at ground (0V) potential. If this nominal condition is maintained, the voltage change across the reference capacitor C2 over the time $T_{REF}$ is equal to the positive operating potential V+, as illustrated $$I_{Q3} = C2 \frac{V^+}{T_{REF}} \quad (2)$$

in FIG. 2. Under this condition, the current $I_{Q3}$ is given in equation (2) in which C2 is the capacitance of the reference capacitor C2, V+ is the voltage of the positive operating potential, and TREF is the time period for which the REF CLK signal is low. The time period for which the REF CLK signal is high need only be of sufficient duration to allow the reference capacitor C2 to charge to the positive operating potential voltage V+.

The negative peak reference voltage $V_{C3}$ is compared to the ground (0V) reference potential in the comparator 40. The fourth and fifth transistors., Q4 and Q5, are coupled in a differential configuration. The peak detecting capacitor C3 is coupled to one input terminal of the comparator 40, while the second input terminal of the comparator 40 is coupled to ground. The third fixed current source I3 conducts a fixed constant current. Some of the current through the third fixed current source I3 comes directly from the positive operating potential source V+through the main conduction path of the fifth transistor Q5, while the rest is the compensating current $I_{COMP}$ conducted through the main conduction path of the fourth transistor Q4. As the compensating current Icomp increases the controlled current I decreases, and as the compensating current $I_{comp}$ decreases, the controlled current I increases. By controlling the compensating current Icomp, the feedback circuit can control the controlled current I.

The comparator 40 operates to maintain the negative peak voltage $V_{C3}$ at ground potential. Referring to time 106 (of FIG. 2), if the controlled current I is too high, then the discharge current $I_{Q3}$ (=$I_{Q2}$=I) through transistor Q3 will be too high, and the reference capacitor C2 will discharge too much. In that case, the negative peak voltage $V_{C3}$ will be too low, i.e. below ground potential. The lower negative peak voltage $V_{C3}$ at the control electrode of the fourth transistor Q4 controls the main conduction path of the fourth transistor Q4 to conduct more current. That is, the compensating current $I_{COMP}$ increases. As described above, as the compensating current $I_{COMP}$ increases, the controlled current I decreases. As the controlled current I decreases, the reference capacitor C2 discharges less, and the negative peak voltage $V_{C3}$ rises toward ground potential.

If the controlled current I is too low, then the reference capacitor C2 discharges too little, and the negative peak voltage $V_{C3}$ will be too high, i.e. above ground potential (time 108). The higher negative peak voltage $V_{C3}$ at the control electrode of the fourth transistor Q4 controls the main conduction path of the fourth transistor Q4 to conduct less current. That is, the compensating current ICOMP decreases. As described, as the compensating current $I_{COMP}$ decreases, the controlled current I increases. As the controlled current I increases, the reference capacitor C2 discharges more, and the negative peak voltage $V_{C3}$ drops toward ground potential. In this manner the feedback circuit dynamically maintains the controlled current I at a predetermined level, which, in turn, discharges the timing capacitor C1 in an accurate manner.

As described above, due to the IC fabrication process the operational parameters of the capacitors C1 and C2, and the transistors Q1, Q2 and Q3 have relatively wide absolute tolerances, from one IC to another. However, within an IC, the values of the capacitors C1 and C2 may be accurately matched to each other, and the areas of the transistors Q1, Q2 and Q3 may be accurately ratioed to each other. In the illustrated embodiment, the capacitance of the timing capacitor C1 is equal to that of the reference capacitor C2, and the transistor areas are ratioed such that I=$I_{Q2}$=$I_{Q3}$= 7·$I_{Q1}$.

Referring back to equations (1) and (2), it may be shown that the voltage amplitude ΔV of the ramp timing output signal is determined by the operating voltage, and the relative periods of the reset and the TEF signals (all generated externally to the IC), provided only that the areas of, and thus the currents through, the transistors Q1, Q2, and Q3 are accurately $$\Delta V = I_{Q1} \frac{T}{C1} \text{ (Equation (1)); and} \quad (3)$$

$$I_{Q3} = C2 \frac{V^+}{T_{REF}} \text{ (Equation (2)); but}$$

$$I_{Q3} = I_{Q2} = nI_{Q1} \text{ or } I_{Q1} = \frac{I_{Q3}}{n}; \text{ thus:}$$

$$\Delta V = \frac{I_{Q3}}{n} \frac{T}{C1}$$

$$\Delta V = \frac{C2}{n} \frac{V^+}{T_{REF}} \frac{T}{C1}; \text{ but}$$

$$C1 = C2; \text{ thus:}$$

$$\Delta V = V^+ \cdot \frac{T}{nT_{REF}}$$

ratioed, and that the capacitance of the capacitors C1 and C2 are accurately matched (see equation set (3)).

Although the ramp timing output signal in the illustrated embodiment is a negative-going ramp, one skilled in the art will understand that the techniques of dynamic current control, and ratio matching may be used to generate other timing signals. In addition, although CMOS transistors of one polarity have been used in the illustrated embodiment, one skilled in the art will understand that any polarity transistor may be used in a timing signal generator in accordance with principles of the present invention. Finally, one skilled in the art will understand that the ramp timing output signal may be totally asynchronous from the reference clock both in phase and frequency.

What is claimed is:

1. A dynamically controlled timing signal generator, comprising:
    a source of a controlled current;
    a timing signal generating circuit, coupled to the controlled current source, for generating a timing signal, said timing signal generating circuit comprising a timing capacitor and a controllable reset switch, coupled between the timing capacitor and a source of a predetermined voltage, and responsive to a reset signal; and
    a feedback circuit, coupled to the controlled current source, the feedback circuit comprising a reference capacitor, matched to the timing capacitor, for generating a reference signal, the feedback circuit being responsive to the reference signal and to a reference clock signal for dynamically controlling the controlled current source to produce a desired controlled current.

2. The generator of claim 1 wherein the controlled current source comprises:
    a fixed current source;
    a first branch, coupled between the fixed current source and the timing signal generating circuit, for conducting the controlled current; and a second branch, coupled between the fixed current source and the feedback circuit, for conducting a compensating current.

3. The generator of claim 2 wherein:

the first branch comprises a current sense transistor; and the feedback circuit comprises:

a current mirror transistor, matched to, and coupled in a current mirror configuration with, the current sense transistor;

the reference capacitor, coupled to the current mirror transistor, for generating a reference timing signal; and control circuitry, responsive to the reference timing signal, for controlling the controlled current to generate the reference timing signal having predetermined timing characteristics.

4. The generator of claim 3 further comprising a controlled switch for alternately coupling the reference capacitor to a source of a predetermined reference voltage and to the current mirror transistor in response to a reference clock signal.

5. The generator of claim 3 wherein the control circuitry comprises:

a controlled switch, having a pole coupled to the reference capacitor, a first terminal coupled to the source of the predetermined voltage, and a second terminal coupled to the current mirror transistor, and responsive to a reference clock signal for alternately coupling the capacitor to the source of the predetermined voltage during a first interval and the current mirror transistor during a second interval;

a peak detector, coupled to the reference capacitor, for detecting the peak voltage of the reference capacitor at the end of the second interval; and a comparator, coupled to the peak detector, for comparing the detected peak voltage of the reference capacitor at the end of the second interval to a predetermined peak reference voltage.

6. The generator of claim 5 wherein the peak detector comprises:

a current source;

a peak detecting capacitor, coupled to the current source; and a diode having a first electrode coupled to the peak detecting capacitor and a second electrode coupled to the reference capacitor.

7. The generator of claim 6 wherein the comparator comprises:

a comparator current source;

a first comparator transistor having a main conduction path coupled between the fixed current source and the comparator current source and a control electrode coupled to the peak detector, for conducting the compensating current; and a second comparator transistor having a main conduction path coupled between the source of the predetermined voltage and the comparator current source.

8. The generator of claim 5 wherein the comparator comprises:

a comparator current source;

a first comparator transistor having a main conduction path coupled between the fixed current source and the comparator current source and a control electrode coupled to the peak detector, for conducting the compensating current; and a second comparator transistor having a main conduction path coupled between the source of the predetermined voltage and the comparator current source.

* * * * *